US012813275B2

(12) United States Patent
Müller et al.

(10) Patent No.: US 12,813,275 B2
(45) Date of Patent: Nov. 24, 2026

(54) SEMICONDUCTOR MODULE WITH A SUBSTRATE AND AT LEAST ONE SEMICONDUCTOR COMPONENT CONTACTED ON THE SUBSTRATE

(71) Applicant: Siemens Aktiengesellschaft, Munich (DE)

(72) Inventors: Volker Müller, Nuremberg (DE); Stephan Neugebauer, Erlangen (DE); Florian Schwarz, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 373 days.

(21) Appl. No.: 18/287,788

(22) PCT Filed: Mar. 25, 2022

(86) PCT No.: PCT/EP2022/057926

§ 371 (c)(1),
(2) Date: Oct. 20, 2023

(87) PCT Pub. No.: WO2022/223237

PCT Pub. Date: Oct. 27, 2022

(65) Prior Publication Data

US 2024/0363487 A1 Oct. 31, 2024

(30) Foreign Application Priority Data

Apr. 21, 2021 (EP) .................................... 21169684

(51) Int. Cl.
*H10W 40/73* (2026.01)
*H10W 40/00* (2026.01)
(Continued)

(52) U.S. Cl.
CPC ......... *H10W 40/73* (2026.01); *H10W 40/037* (2026.01); *H10W 70/023* (2026.01);
(Continued)

(58) Field of Classification Search
CPC ............... H01L 23/421; H01L 21/4875; H01L 21/4882; H01L 24/40; H01L 25/0655; H01L 2224/40225; H01L 2924/1815
(Continued)

(56) References Cited

U.S. PATENT DOCUMENTS 5,933,323 A 8/1999 Bhatia et al.
2002/0100968 A1 8/2002 Zuo et al.
(Continued)

FOREIGN PATENT DOCUMENTS

DE 102004018476 A1 11/2005
DE 102012205590 A1 10/2013
(Continued)

OTHER PUBLICATIONS

PCT International Search Report and Written Opinion of International Searching Authority mailed Mar. 8, 2022 corresponding to PCT International Application No. PCT/EP2022/057926 filed Mar. 25, 2022.

*Primary Examiner* — Phuc T Dang
(74) *Attorney, Agent, or Firm* — Henry M Feiereisen, LLC

(57) ABSTRACT

A semiconductor module includes a heat sink, a substrate connected to the heat sink, a semiconductor component in contact with the substrate, and a planar cooling element designed to include a hermetically sealed duct structure for arrangement of a heat transport medium such that the hermetically sealed duct structure and the heat transport medium form a pulsating heat pipe. The planar cooling element is designed to establish a thermal connection between a substrate-distal side of the semiconductor component and the heat sink and to have a shape which is adapted to a height profile of a circuit layout having height offsets.

21 Claims, 8 Drawing Sheets

(51) Int. Cl.
*H10W 70/02* (2026.01)
*H10W 74/10* (2026.01)
*H10W 90/00* (2026.01)

(52) U.S. Cl.
CPC ............ *H10W 74/10* (2026.01); *H10W 90/00* (2026.01); *H10W 90/764* (2026.01)

(58) Field of Classification Search
USPC .......................................................... 257/712
See application file for complete search history.

(56) References Cited

U.S. PATENT DOCUMENTS

| | | | | |
|---|---|---|---|---|
| 2005/0230820 | A1 | 10/2005 | Licht | |
| 2009/0321924 | A1* | 12/2009 | Funakoshi | H01L 23/4735 257/722 |
| 2012/0085520 | A1 | 4/2012 | Pfaffinger | |
| 2020/0118986 | A1* | 4/2020 | Hori | H01L 23/50 |
| 2020/0381370 | A1 | 12/2020 | Pfefferlein | |
| 2021/0050290 | A1 | 2/2021 | Ochs et al. | |
| 2022/0151116 | A1 | 5/2022 | Schwarz | |
| 2022/0208643 | A1 | 6/2022 | Bigl et al. | |

FOREIGN PATENT DOCUMENTS

| | | | | |
|---|---|---|---|---|
| DE | 102016117843 | A1 * | 3/2018 | H01L 23/473 |
| EP | 3547360 | A1 | 10/2019 | |
| EP | 3625823 | A1 | 3/2020 | |
| EP | 3751605 | A1 | 12/2020 | |
| JP | 2019134018 | A * | 8/2019 | H01L 23/3735 |
| WO | WO-2020189508 | A1 * | 9/2020 | H01L 43/49541 |
| WO | WO 2020207669 | A1 | 10/2020 | |

* cited by examiner

SEMICONDUCTOR MODULE WITH A SUBSTRATE AND AT LEAST ONE SEMICONDUCTOR COMPONENT CONTACTED ON THE SUBSTRATE

CROSS-REFERENCES TO RELATED APPLICATIONS

This application is the U.S. National Stage of International Application No. PCT/EP2022/057926, filed Mar. 25, 2022, which designated the United States and has been published as International Publication No. WO 2022/223237 A1 and which claims the priority of European Patent Application, Serial No. 21169684.4, filed Apr. 21, 2021, pursuant to 35 U.S.C. 119 (a)-(d).

BACKGROUND OF THE INVENTION

The invention relates to a semiconductor module having a substrate and at least one semiconductor component which is in contact with the substrate, wherein the substrate is connected to a heat sink, in particular by a material bond.

Moreover, the invention relates to a power converter having at least one such semiconductor module.

Furthermore, the invention relates to a method for producing a semiconductor module having a substrate and at least one semiconductor component which is in contact with the substrate, wherein the substrate is connected to a heat sink, in particular by a material bond.

Such semiconductor modules are generally used in a power converter. A power converter is to be understood to be, for example, a rectifier, an inverter, a converter or a DC-DC converter.

With the advancing miniaturization in integrated circuit packaging technology, for example using planar integrated packaging technology, the power density in semiconductor modules is increasing. In order to avoid electronic failures due to thermal overloads, concepts which are increasingly more effective but also more cost-effective are therefore required for cooling semiconductor components.

The published unexamined patent application EP 3 625 823 A1 describes a power module having at least one power semiconductor, in particular a power transistor, which has a first contact surface and a second contact surface lying opposite the first contact surface, and a substrate which comprises at least two interconnected layers which are arranged one above the other. In order to achieve a higher resistance with respect to humidity in comparison to the prior art and to enable a low inductance planar connection of the at least one power semiconductor, it is proposed that the first layer comprises a first dielectric material with at least a first metallization, wherein the first metallization is arranged on a side which is facing the second layer, wherein the second layer comprises a second dielectric material with at least a second metallization, wherein the second metallization is arranged on a side which is facing away from the first metallization, wherein the power semiconductor is connected to the first metallization via the first contact surface, wherein the power semiconductor is arranged in a first recess of the second layer, wherein a metal first encapsulation is arranged in such a manner that the power semiconductor is encapsulated in a fluid-tight manner and the second contact surface of the power semiconductor is electrically conductively connected to the second metallization via the first encapsulation.

The published unexamined patent application EP 3 547 360 A1 describes a semiconductor assembly comprising a carrier element having a first carrier element conductor track, a semiconductor, an electrically insulating element comprising a first insulating element conductor track, and a first spacer element, wherein the semiconductor is electrically and mechanically connected at a first semiconductor side to the first carrier element conductor track by means of a first connecting material, wherein the semiconductor is electrically and mechanically connected at a second semiconductor side, which is facing away from the first semiconductor side of the semiconductor, by means of a second connecting material, to the first insulating element conductor track which is arranged on a first insulating element side of the electrically insulating element, and wherein the first spacer element is arranged so as to maintain a distance between the carrier element and a subassembly element which is facing the second semiconductor side of the semiconductor and is mechanically connected to the carrier element and the subassembly element, respectively.

The published unexamined patent application EP 3 751 605 A1 describes an electronic circuit having a first and a second circuit carrier and a first and a second semiconductor component. The first semiconductor component lies with an upper side against a lower side of the first circuit carrier and with a lower side against an upper side of the second circuit carrier. The first circuit carrier has a first through-contact which connects the first semiconductor component to a first conductor track. The first circuit carrier has a second through-contact which electrically connects a connecting element to a further conductor track, said connecting element being arranged between the circuit carriers. A material-bonded connection between the circuit carriers is produced via the first connection element. The second semiconductor component lies against the lower side of the first circuit carrier and is electrically connected to the first or second conductor track.

The published unexamined patent application WO 2020/207669 A1 describes a heat transfer apparatus comprising at least one heat dissipating structure and at least one heat chamber, wherein the heat dissipating structure and the heat chamber are coupled to form a sealed thermal circuit, wherein the heat dissipating structure comprises an outlet duct which extends from the heat chamber and which issues into at least one return duct at an end which is facing away from the heat chamber, wherein the return duct is smaller in size than the output duct and issues into the heat chamber, and wherein the at least one heat chamber is a boiling or vapor chamber and the at least one heat dissipating structure is a duct structure having vapor regions and liquid regions, wherein the heat chamber and the heat dissipating structure together form a pulsating or oscillating heating structure mechanism.

The published unexamined patent application US 2020/118986 A1 describes a semiconductor arrangement having semiconductor modules that are sealed with a resin and each having first and second terminal clamps that protrude from the resin, a capacitor having third and fourth terminal clamps, a cooler which is in direct contact with the semiconductor modules and the capacitor, a bus bar having a first bus bar which connects the first terminal clamp to the third terminal clamp, a second bus bar which connects the second terminal clamp to the fourth terminal clamp, and a first insulation layer which is disposed between the first and second bus bars.

Based on this background, the object underlying the invention is to propose a semiconductor module arrangement which enables more effective heat dissipation in comparison to the state of the art.

SUMMARY OF THE INVENTION

This object is achieved in accordance with the invention in that a semiconductor module of the type mentioned in the introduction comprises a planar cooling element which has a hermetically sealed duct structure in which a heat transport medium is arranged, wherein a pulsating heat pipe is formed by the hermetically sealed duct structure and the heat transport medium, wherein a thermal connection is produced between a side of the at least one semiconductor component, said side facing away from the substrate, and the heat sink via the planar cooling element, wherein a shape of the planar cooling element is adapted to a height profile of the respective circuit layout which at least has height offsets.

Moreover, the object is achieved in accordance with the invention by a power converter having at least one such semiconductor module arrangement.

Furthermore, the object is achieved in accordance with the invention in that, in the case of a method for producing a semiconductor module of the type mentioned in the introduction, a thermal connection is produced between a side of the at least one semiconductor component, said side facing away from the substrate, and the heat sink via a planar cooling element, wherein the planar cooling element has a hermetically sealed duct structure in which a heat transport medium is arranged, wherein a pulsating heat pipe is formed by the hermetically sealed duct structure and the heat transport medium, wherein a shape of the planar cooling element is adapted to a height profile of the respective circuit layout which at least has height offsets.

The advantages and preferred embodiments mentioned below with regard to the semiconductor module can be expediently transferred to the power converter and the production process.

The invention is based on the consideration that an additional thermal path having a pulsating heat pipe is provided in a semiconductor module so that the heat dissipation is improved by heat spreading. A pulsating heat pipe (HP), which is also referred to as an oscillating heat pipe, (OHP) is an apparatus for heat transfer using a sealed duct structure, in which a heat transport medium, in particular a heat transport fluid, is arranged which vapor segments and liquid segments alternate along the duct structure due to the surface tension of the heat transport medium. These vapor and fluid segments are excited by a temperature gradient so as to pulsate or oscillate. At a heat source, the vapor segments expand due to the higher temperature; in addition, liquid heat transport medium boils there and absorbs latent heat in the process. At a heat sink, the vapor segments shrink due to condensation of gaseous heat transport medium and give off latent heat in the process. The local temperature and pressure differences drive the constant pulsation or oscillation of the vapor and liquid segments.

The semiconductor module has a substrate and at least one semiconductor component which is in contact with the substrate, wherein the substrate is connected to a heat sink, in particular by a material bond. The semiconductor component can be designed as a transistor, in particular as an insulated gate bipolar transistor. Moreover, the transistor can have an antiparallel diode. Alternatively, the semiconductor component can be designed as a digital logic module, in particular as a field programmable gate array (FPGA), or as another semiconductor. The heat sink comprises for example a base plate and/or a cooling body. The additional heat path, which runs, for example, on an upper side of the semiconductor module, is created by producing a thermal connection between a side of the at least one semiconductor component, said side facing away from the substrate, and the heat sink by means of a planar cooling element. In particular, such a cooling element is considered to be planar if its thickness, for example in the case of a substantially rectangular base area, is at most 10% of an average value of a shortest and a longest side length, wherein the length of the shortest side is at least 10% of the length of the longest side. In particular, a maximum thickness of the planar cooling element is 4 mm, in particular 2 mm. For example, the planar cooling element is in contact with a metallization of the substrate and/or with the heat sink as well as with a contact surface of the semiconductor component, which is arranged on a side which is facing away from the substrate. The planar cooling element has a hermetically sealed duct structure in which a heat transport medium is arranged, wherein a pulsating heat pipe is formed by the hermetically sealed duct structure and the heat transport medium. Such a duct structure can be achieved, for example, by means of a sheet metal structure. The heat transport medium is designed in particular as a heat transport fluid which comprises, for example, water, acetone or methanol. The duct structure comprises, for example, ducts having a circular cross-section, wherein the circular cross-section has in particular a maximum diameter of 3 mm, in particular 1 mm. For example, the ducts of the hermetically sealed duct structure are arranged in a meandering and/or loop shape manner so that heat spreading takes place by virtue of the pulsating heat pipe. A heat flow direction can be flexibly adjusted by the course of the ducts. The additional heat path and the heat spreading enable effective heat dissipation. At the same time, the temperatures in the semiconductor module are homogenized, which has a positive effect on the service life or robustness in comparison to one-sided load cases. Such a homogenization of the temperatures is advantageous especially when using semiconductors which are connected in parallel within the module. A main heat path which runs via the substrate to the heat sink is relieved by two-sided heat dissipation.

A shape of the planar cooling element is adapted to a height profile of the respective circuit layout, which at least has height offsets. By adapting to the height profile of the circuit layout, height and possibly angle offsets, for example due to the semiconductor components and further circuitry, are compensated. Due to a geometric adaptability to the respective circuit layout, intermediate elements can be dispensed with, which reduces thermal contact resistances. Furthermore, a thickness and thus a required installation space is reduced.

A further embodiment provides that the planar cooling element is designed in a flexible manner at least in sections. The flexible design at least in sections enables reshaping by deformation. Moreover, even in the case of alternating loads, in particular thermal loads, reliable heat dissipation is ensured by the design which is flexible at least in sections.

A further embodiment provides that the planar cooling element is connected to the semiconductor component by a material bond or a non-positive connection. A material-bonded connection can be produced, for example, by means of soldering, sintering or adhering, which leads to a stable connection with low thermal contact resistances. A non-positive connection can be produced, for example, by at least one elastic contact pressure element. Such a connection can be detached in a simple manner and is simple to realize.

A further embodiment provides that the planar cooling element is produced at least in part by means of an additive process. Such an additive process is, for example, selective laser sintering (SLS) or an extrusion process, whereby even complex geometries, which in particular comprise a plastic, can be produced in a comparatively simple and cost-effective manner. By combining the additive manufacturing process with another manufacturing process, composite materials such as fiber composites in particular can be manufactured efficiently.

A further embodiment provides that the planar cooling element is produced by means of a casting process. Such a casting process is, for example, gas injection or centrifugal casting. Such a casting process is cost-effective and reliably reproducible, especially for large quantities.

A further embodiment provides that the planar cooling element is produced from profiled and joined metal sheets. Such metal sheets comprise, for example, copper and have an at least partially wave-shaped profiling. Profiling is produced, for example, by bending, embossing or milling. At least two metal sheets are connected by a material bond, for example, by means of a non-detachable connection, in particular a welded connection and/or a soldered connection, so that ducts are formed between the metal sheets. Such a planar cooling element can be produced in a simple and cost-effective manner.

A further embodiment provides that the hermetically sealed duct structure comprises a finally formed duct, which is produced by deformation of the planar cooling element from a pre-formed duct, wherein a geometry of the finally formed duct differs from a geometry of the pre-formed duct. In particular, a geometry of a duct is defined by a cross-section. For example, the geometry of the finally formed duct is a target geometry which comprises a circular duct cross-section, wherein the pre-formed duct has, for example, an oval cross-section. Such a pre-formed duct ensures that the duct structure comprises sufficiently open ducts even in the event of deformation of the planar cooling element.

A further embodiment provides that the planar cooling element is at least in part produced from a thermally conductive and electrically insulating material. Such a material is, for example, a ceramic material or a plastic, which is in particular filled with a ceramic material. Such a material means that a dedicated insulation layer 20 is not required, for example, so that thermal contact resistances are reduced.

A further embodiment provides that the planar cooling element is produced from a metal material, wherein an insulation layer is arranged between the semiconductor component and the planar cooling element. The metal material comprises, for example, copper or aluminum. The insulation layer is designed, for example, as a film, in particular an already provided film, which is in particular produced from an insulating material, so that heat generated in the semiconductor component can be efficiently dissipated via the planar cooling element which is produced from the metal material.

A further embodiment provides that the planar cooling element is at least in part produced from a metal material, wherein the planar cooling element is in direct contact with a contact surface of the semiconductor component. Direct contact is to be understood as a direct contact which includes, for example, connecting means for producing a material-bonded connection, such as adhesive, solder or sintering paste, but excludes an additional connecting element, such as an additional conductor, a metal sheet or a spacer, in particular between the planar cooling element and the contact surface of the semiconductor component. For example, the planar cooling element which is produced from a metal material is connected by a material bond to the contact surface of the semiconductor component as well as to the first metallization of the substrate. The material-bonded connection is produced, for example, by soldering. Such a direct connection reduces thermal contact resistances.

A further embodiment provides that the planar cooling element is configured to conduct a load current of the contacted semiconductor component. The planar cooling element thus functions as a conductor. Thus, installation space and costs are saved.

BRIEF DESCRIPTION OF THE DRAWING

The invention will be described and explained below in more detail with reference to the embodiments shown in the figures.

In the drawings.

DETAILED DESCRIPTION OF PREFERRED EMBODIMENTS

Figure 1:
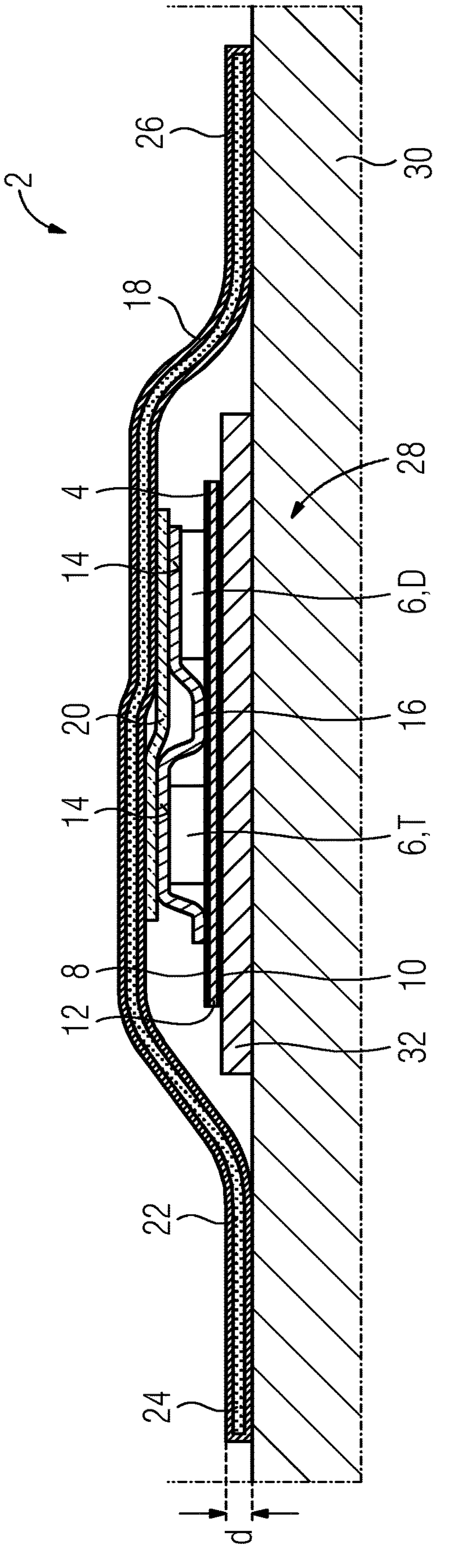
FIG. 1 shows a cross-sectional schematic representation of a first embodiment of a semiconductor module.

The exemplary embodiments which are explained below are preferred embodiments of the invention. In the exemplary embodiments, the described components of the embodiments each represent individual features of the invention which are to be considered independently of one another and which each also further the invention independently of one another and are thus also to be regarded as a component of the invention individually or in a combination other than that shown. Furthermore, the embodiments described can also be supplemented by further of the features of the invention already described.

Identical reference characters have the same meaning in the various figures.

FIG. 1 shows a schematic representation of a first embodiment of a semiconductor module 2, which comprises a substrate 4 and semiconductor components 6 which are in contact with the substrate 4. The substrate 4 has an, in particular structured, first metallization 8 and the semiconductor components 6 are in contact with said metallization. The, in particular structured, first metallization 8 is designed, for example, as copper plating. In particular, the semiconductor components 6 are connected to the first metallization 8 of the substrate 4 by a material bond. The material-bonded connection is produced, for example, by soldering, adhering or sintering. In addition, the substrate 4 has on a side, which is facing away from the semiconductor components 6, a second metallization 10, which comprises, for example, copper and by a dielectric material layer 12 is electrically insulated from the first metallization 8 and thermally conductively connected. The dielectric material layer 12 has, for example, a thickness of 25 μm to 400 μm, in particular 50 μm to 300 μm, and comprises a ceramic material, for example aluminum nitride or aluminum oxide, or an organic material, for example a polyamide. The substrate 4 can alternatively be designed as an IMS substrate, in which in particular the second metallization 10 is omitted.

The semiconductor components 6 in FIG. 1 are designed by way of example as a transistor T, in particular as an insulated gate bipolar transistor (IGBT), having an antiparallel diode D. For the sake of clarity, a control contact, in particular a gate contact, of the IGBT is not illustrated in FIG. 1. Alternatively, at least one semiconductor component 6 is designed as a digital logic module, in particular as a field programmable gate array (FPGA), or as another semiconductor. The semiconductor components 6 have a contact surface 14 on a side which is facing away from the substrate 4. The contact surfaces 14 of the semiconductor components 6 are connected to the first metallization 8 of the substrate 4 via a planar conductor connection 16. The planar conductor connection 16 is designed, for example as a copper metal sheet.

A planar cooling element 18 is connected to the contact surfaces 14 of the semiconductor components 6 in a thermally conductive manner. The planar cooling element 18 is produced, for example, from a metal material which comprises in particular copper and/or aluminum, wherein an insulation layer 20, which is produced from a thermally conductive and electrically insulating material, for example a plastic or a ceramic material, is arranged between the semiconductor components 6 and the planar element 18. The insulation layer 20 is designed, for example, as a film which is in particular already provided and is produced in particular from an insulating material. The planar cooling element 18 is connected to the semiconductor components 6 by a material bond. For example, the planar connection 16 is soldered onto the contact surfaces 14 of the semiconductor components 6, whereas the insulation layer 20 is connected to the planar conductor connection 16 and the planar cooling element 18 is connected to the insulation layer 20 by adhesion connected by a material bond. Alternatively, the insulation layer 20 can be part of the planar conductor connection 16 and/or of the planar cooling element 18 which is produced from a metal material. For example, an insulation layer 20 is produced by controlled oxidation of the metal material or applied by an additive process, for example cold gas spraying. Alternatively, the planar cooling element 18 can be produced from an electrically insulating material and an electrically conductive material which is connected to the electrically insulating material, in particular by a material bond, wherein the electrically insulating material is arranged at least in the area of the contact to the contact surface 14 of the semiconductor components 6, so that a dedicated insulation layer 20 is not required.

The planar cooling element 18 which has, for example, a thickness of 0.5 mm to 4 mm, in particular 0.5 mm to 2 mm, comprises a hermetically sealed duct structure 22, in which a heat transport medium 24 is arranged, wherein a pulsating heat pipe 26 is formed by the hermetically sealed duct structure 22 and the thermal transport medium 24. The heat transport medium 24 is designed in particular as a heat transport fluid which comprises, for example, water, acetone or methanol. The duct structure 22 comprises, for example, ducts having a circular cross-section, wherein the circular cross-section has in particular a maximum diameter of 3 mm, in particular 1 mm. For example, the ducts of the duct structure 22 are arranged in a meandering and/or loop shape manner so that heat spreading takes place by virtue of the pulsating heat pipe 26. Moreover, the planar cooling element 18 is designed in a flexible manner at least in sections, wherein a shape of the planar cooling element 18 is adapted to a height profile of the circuit layout. By adapting said shape to the height profile of the circuit layout, height and possibly angle offsets due to the semiconductor components 6 and further circuitry are compensated.

The second metallization 10 of the substrate 4 is connected, in particular over the entire area and/or by a material bond, to a heat sink 28, wherein the heat sink 28 comprises a cooling body 30 and an optional base plate 32. The planar cooling element 18 is connected to the heat sink 28 by a material bond and thus produces a thermal connection of the contact surfaces 14 of the semiconductor components 6 to the heat sink 28. In FIG. 1, the planar cooling element 18 is connected to the cooling body 30 by a material bond. The material-bonded connection, which is produced, for example, by soldering, can be produced in addition or as an alternative to the optional base plate 32. In particular, by designing the planar cooling element 18 in a flexible manner at least in sections, a large area contact is made possible in the area of the semiconductor components 6 and the heat sink 28, wherein more uniform and lower temperatures are achieved due to the large area contact. The planar cooling element 18 together with the pulsating heat pipe 26 creates a second heat path on the upper side of the semiconductor module 2, which dissipates the heat which is generated in the semiconductor components 6 onto the heat sink 28. This second heat path relieves a main heat path, which runs over the substrate 4, and at the same time assumes the function of additional heat spreading on the heat sink 28 as well as within the semiconductor module 2.

Figure 2:
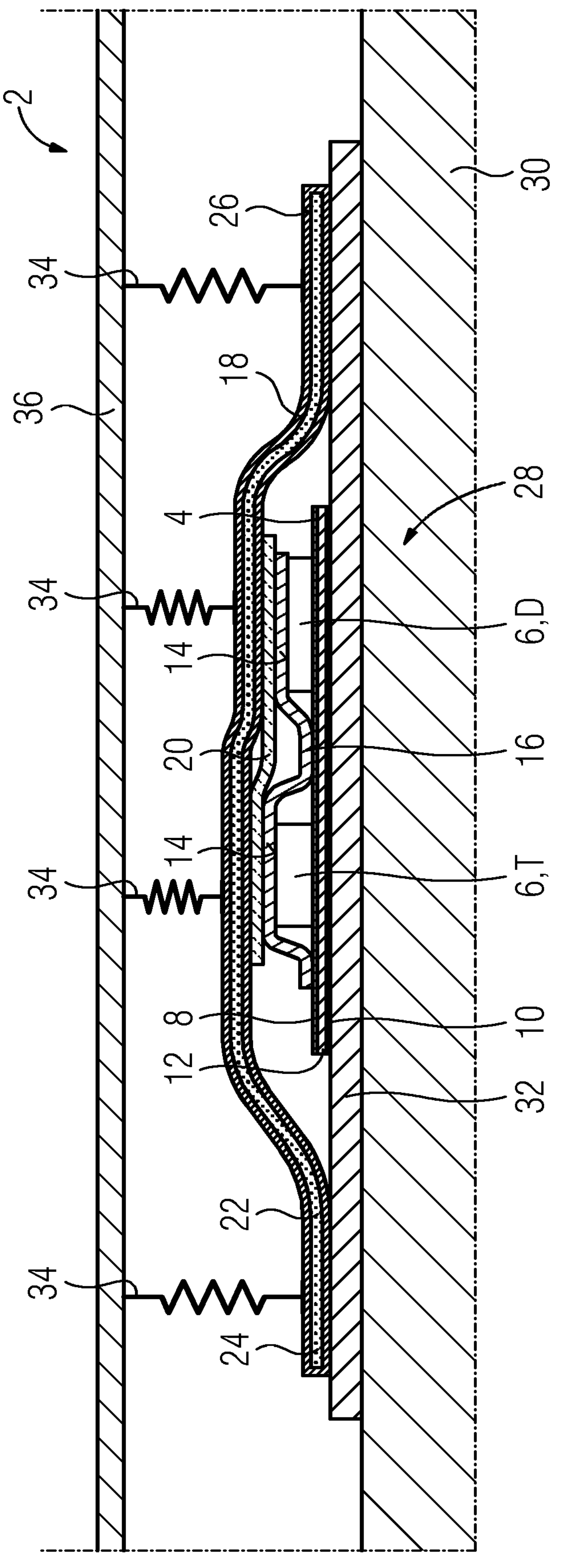
FIG. 2 shows a cross-sectional schematic representation of a second embodiment of a semiconductor module.

FIG. 2 shows a cross-sectional schematic representation of a second embodiment of a semiconductor module 2. The planar cooling element 18 is connected to the heat sink 28 in a non-positive manner, wherein the non-positive connection is produced by virtue of the elastic contact pressure elements 34. The elastic contact pressure elements 34 which are connected to a housing 36 are designed, for example, as spring contacts which comprise in particular a leaf spring or a helical spring.

The planar cooling element 18 can be produced at least in part from a thermally conductive and electrical insulating material. Such a thermally conductive and electrical insulating material is, for example, a plastic which is filled in particular with a ceramic material. The further embodiment of the semiconductor module 2 in FIG. 2 corresponds to the embodiment in FIG. 1.

Figure 3:
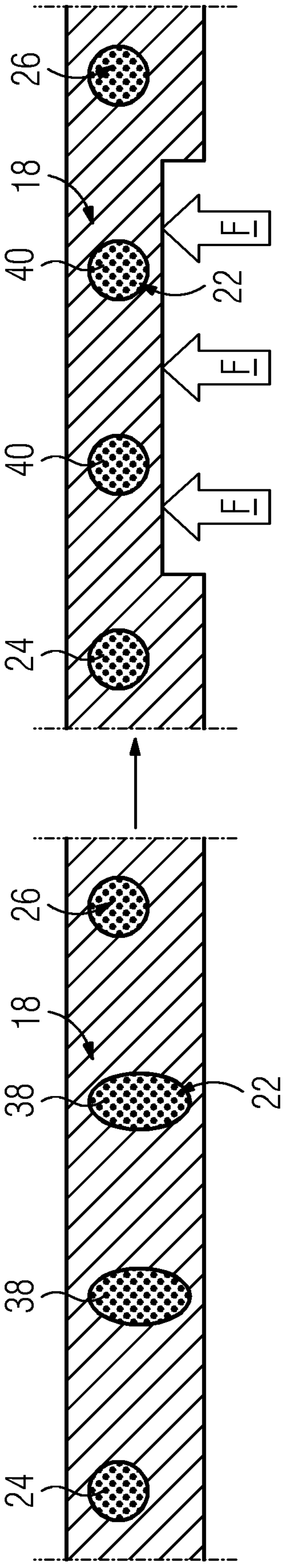
FIG. 3 shows a schematic representation of a deformation of a planar cooling element.

FIG. 3 shows a schematic representation of a deformation of a planar cooling element 18. The planar cooling element 18 is produced, for example, by means of an additive process, in particular by an extrusion process or selective laser sintering (SLS). Alternatively, the planar cooling element 18 is manufactured by means of a casting process, for example centrifugal casting, gas injection, or by welding, soldering or gluing suitably bent or embossed metal sheets. This renders it possible for a base body which is created in a spatially planar manner to be bent, drawn or embossed, so that its surfaces are in suitable correlation with the height profile of the circuit layout, in particular of the electronic components which are to be cooled. Mechanical stresses and gaps are thus prevented in the best possible manner. Furthermore, the planar cooling element 18 can be produced at least in part by extrusion, plastic extrusion or injection molding.

By virtue of deformation or reshaping, which is accompanied by the application of a force F, an original geometry, in particular an original cross-section, of at least some ducts is changed, in particular in the area of the reshaping. Pre-formed ducts 38, which have for example an elliptical cross-section, at least partially compensate for a change in geometry by deformation, so that the finally formed ducts 40 have an essentially circular target cross-section. The ducts 40 which are finally formed by deformation have a target geometry which comprises, for example, an essentially circular cross-section at least of one finally formed duct 40.

Remaining minimum angle and/or height offsets can be mitigated by selectively reducing the duct cross-section and/or wall cross-section, since this makes the pulsating heat pipe 26 more flexible. Such flexibility is simple to realize in the case of a pulsating heat pipe 26 due to the small duct cross-sections. A local cross-section reduction by embossing or cut-outs between the ducts enables further flexibility. Any remaining geometric deviations with respect to the circuit are compensated for during assembly, for example by gap fillers or thermally conductive adhesives. The further embodiment of the planar cooling element 18 in FIG. 3 corresponds to the embodiment in FIG. 2.

Figure 4:
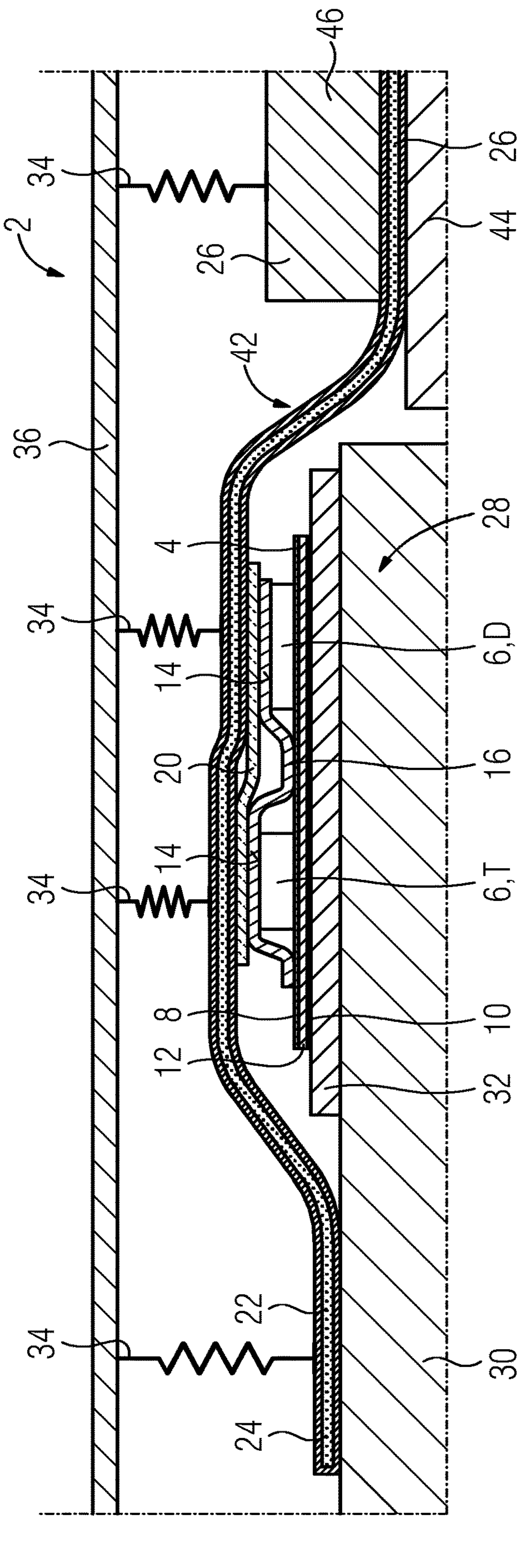
FIG. 4 shows a cross-sectional schematic representation of a third embodiment of a semiconductor module.

FIG. 4 shows a cross-sectional schematic representation of a third embodiment of a semiconductor module 2. The planar cooling element 18 having the pulsating heat pipe 26 protrudes over the cooling body 30 having the base plate 32, wherein at a protruding end 42 further heat sinks 44, 46 are contacted on both sides at least in a non-positive manner. At least one of the two heat sinks 44, 46 can comprise a circuit board, in particular a printed circuit board (PCB). The further embodiment of the semiconductor module 2 in FIG. 4 corresponds to the embodiment in FIG. 2.

Figure 5:
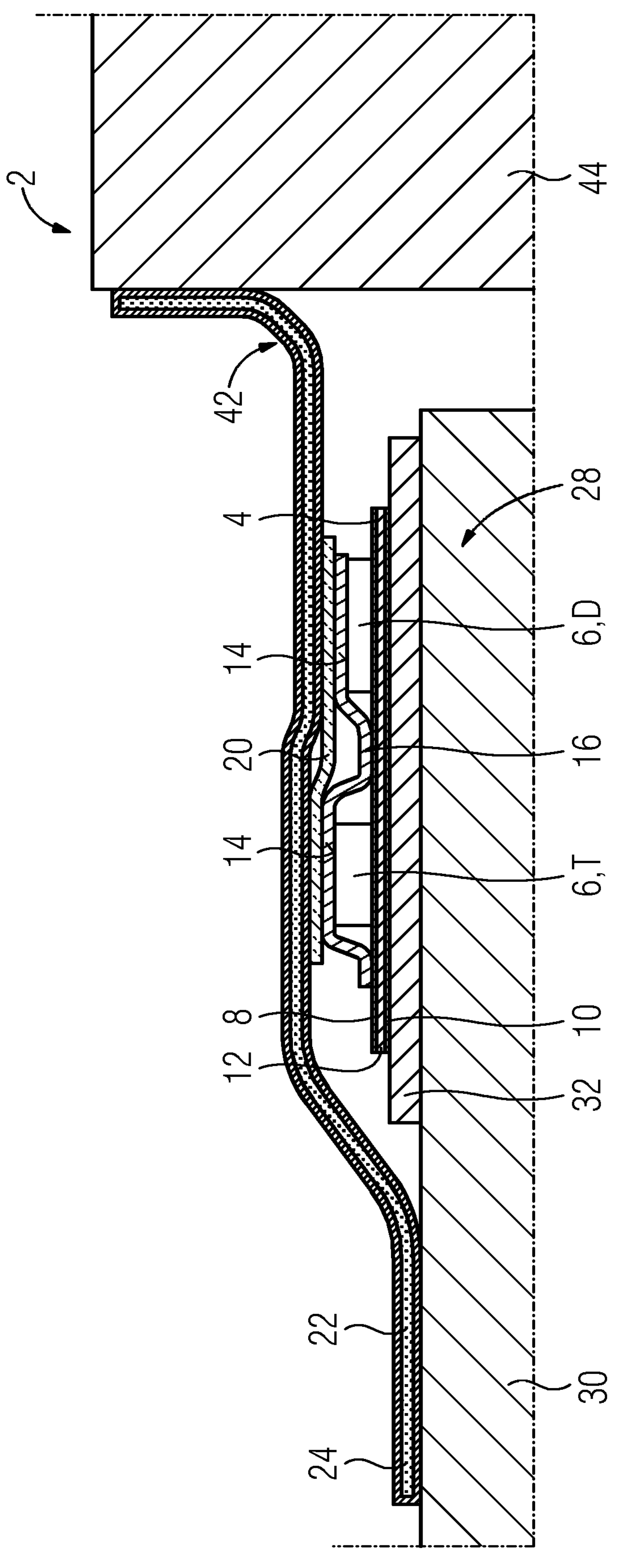
FIG. 5 shows a cross-sectional schematic representation of a fourth embodiment of a semiconductor module.

FIG. 5 shows a cross-sectional schematic representation of a fourth embodiment of a semiconductor module 2. The planar cooling element 18 having the pulsating heat pipe 26 protrudes over the cooling body 30 having the base plate 32, wherein a further heat sink 44 is contacted at a protruding end 42. By way of example, the planar cooling element 18 is connected by a material bond to the cooling body 30, to the semiconductor components 6 and to the further heat sink 44. The planar cooling element 18 is arranged perpendicular to the material-bonded connection to the cooling body 30 in the area of the material-bonded connection to the further heat sink 44. The further heat sink 44 can comprise a circuit board, in particular a printed circuit board (PCB). The further embodiment of the semiconductor module 2 in FIG. 5 corresponds to the embodiment in FIG. 4.

Figure 6:
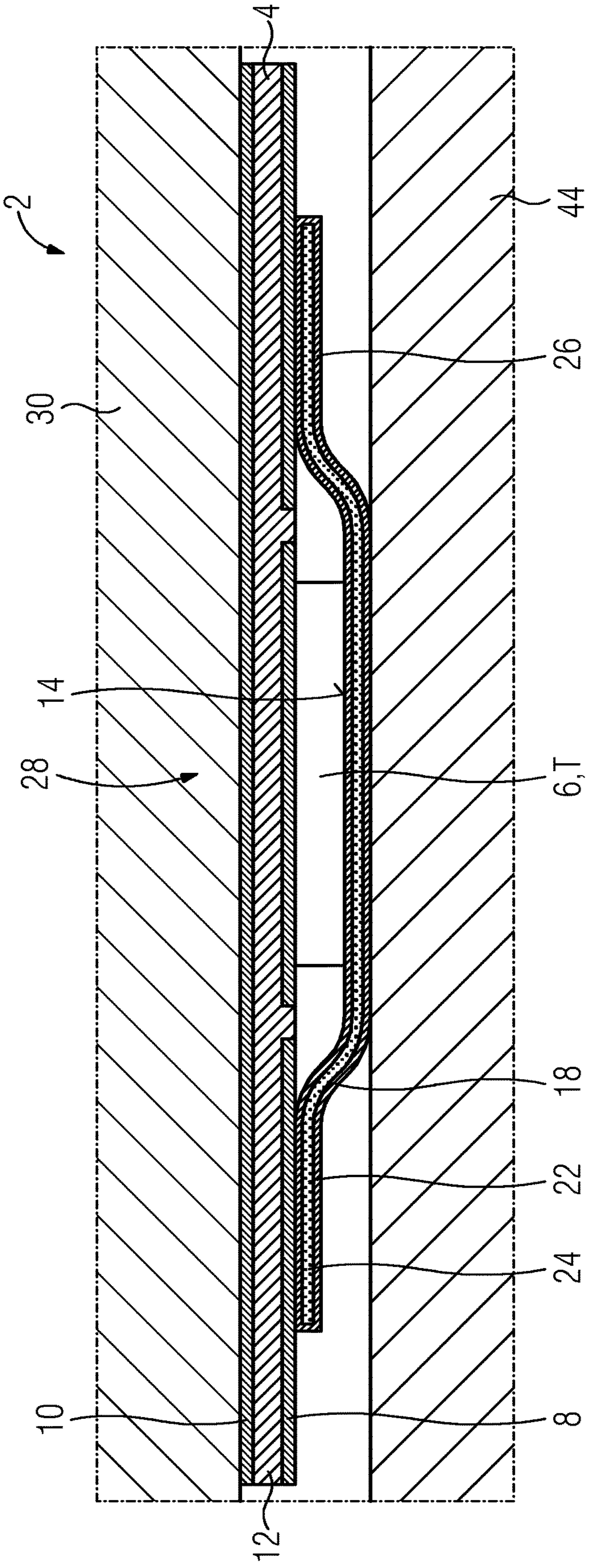
FIG. 6 shows a cross-sectional schematic representation of a fifth embodiment of a semiconductor module.

FIG. 6 shows a cross-sectional schematic representation of a fifth embodiment of a semiconductor module 2. The planar cooling element 18 is in contact with the contact surface 14 of the semiconductor component 6, which is designed as a transistor T, and with the first metallization 8 of the substrate 4, so that a thermal connection is produced between the contact surface 14 of the semiconductor component 6 and the heat sink 28. For the sake of clarity, a control contact of the transistor T is also not shown in FIG. 6.

For example, the planar cooling element 18 is produced from a metal material and is designed as a conductor which is in direct contact with the contact surface 14 of the semiconductor component 6. Direct contact is to be understood as a direct contact which includes connecting means for producing the material-bonded connection, such as adhesive, solder or sintering paste, but excludes an additional connecting element, such as an additional conductor, a metal sheet or a spacer. For example, the planar cooling element 18 which is produced from a metal material is connected by a material bond to the contact surface 14 of the semiconductor component 6 as well as to the first metallization 8 of the substrate 4. The material-bonded connection is produced, for example, by soldering. In addition to the heat transport, the planar cooling element 18 which is produced from a metal material conducts a load current of the contacted semiconductor component 6, the planar cooling element 18 thus functions as a conductor.

Optionally, a further heat sink 44, which is arranged, by way of example, running parallel to the substrate 4 is in contact with the planar cooling element 18. In particular, contact with further heat sink 44 is made in an electrically insulating and thermally conductive manner so that cooling can take place via the further heat sink 44 but no current flows out. The further heat sink 44 can comprise a circuit board, in particular a printed circuit board (PCB). Moreover, the further heat sink 44 can press the planar cooling element 18, in particular in addition, onto the contact surface 14 of the semiconductor component 6. So as to provide electrical insulation, the further heat sink 44 has, for example, a coating having a thermally conductive insulator, in particular a ceramic material, at least in the area of the contact with the planar cooling elements 18. Alternatively, an insulation layer 20 is arranged between the planar cooling element 18 and the further heat sink 44, as illustrated in FIG. 1. A plastic film can be laminated to the planar cooling element 18 for dedicated insulation. Alternatively, the planar cooling element 18 can be produced from a composite material that has an insulating material at least in the area of contact with the further heat sink 44, so that a dedicated insulation layer 20 is not required. In particular, the planar cooling element 18 can be designed as an IMS substrate or as 3D-MID. The further embodiment of the semiconductor module 2 in FIG. 6 corresponds to the embodiment in FIG. 1.

Figure 7:
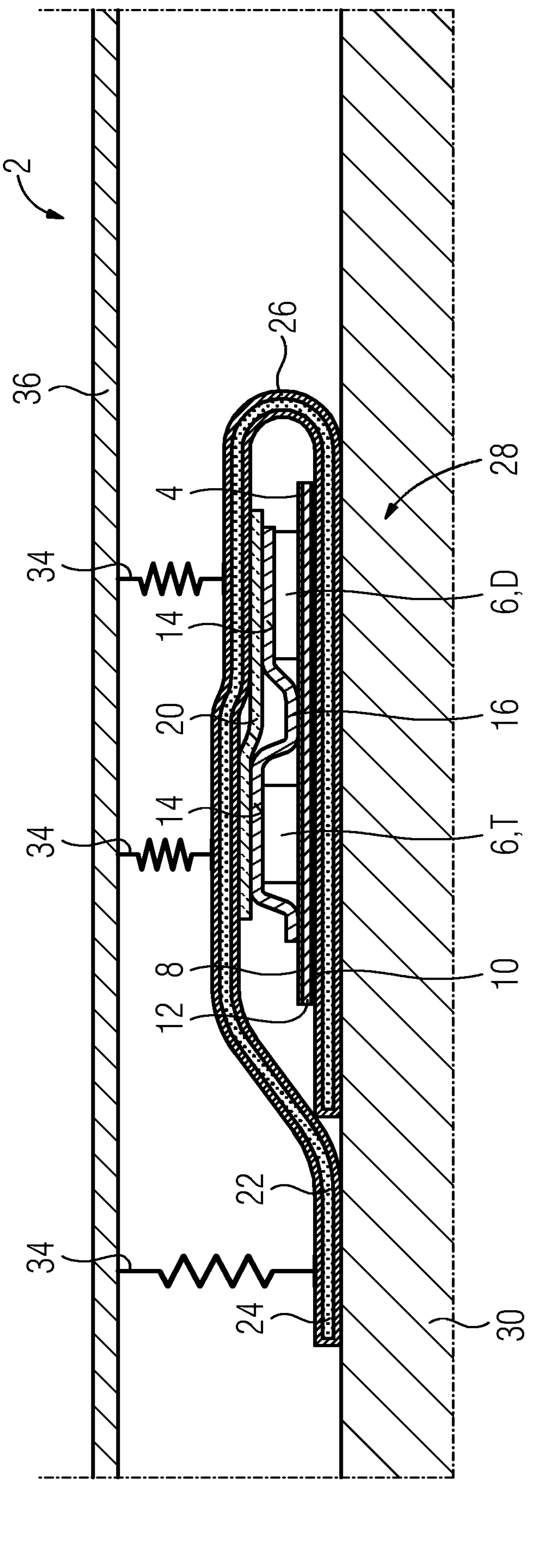
FIG. 7 shows a cross-sectional schematic representation of a sixth embodiment of a semiconductor module.

FIG. 7 shows a cross-sectional schematic representation of a sixth embodiment of a semiconductor module 2. The planar cooling element 18 is designed in a folded manner and in addition is arranged running between the substrate 4 and the heat sink 28, so that the semiconductor components 6 are cooled on both sides by virtue of the pulsating heat pipe 26, as a result of which a homogeneous temperature distribution is achieved. The further embodiment of the semiconductor module 2 in FIG. 7 corresponds to the embodiment in FIG. 2.

Figure 8:
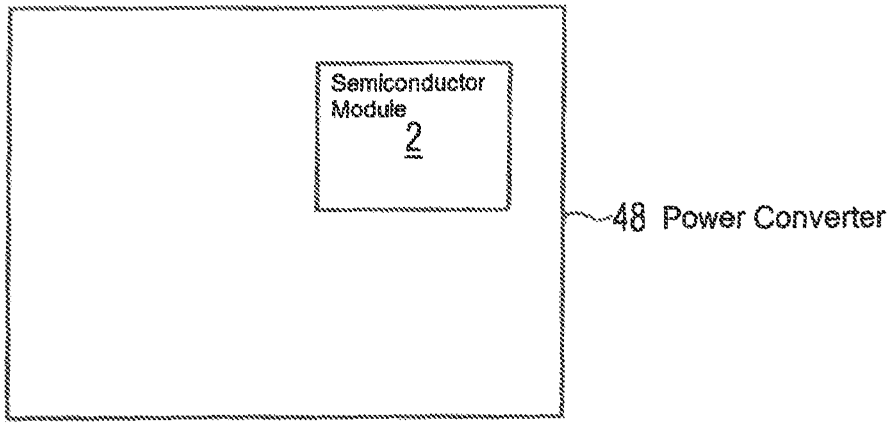
FIG. 8 shows a schematic representation of a power converter having a semiconductor module.

FIG. 8 shows a schematic representation of a power converter 48 having a semiconductor module 2. The power converter 48 can comprise more than one semiconductor module 2.

To summarize, the invention relates to a semiconductor module 2 having a substrate 4 and at least one semiconductor component 6 which is in contact with the substrate 4, wherein the substrate 4 is connected to a heat sink 28, in particular by a material bond. In order to enable more effective heat dissipation in comparison to the prior art, a planar cooling element 18 is proposed which has a hermetically sealed duct structure 22 in which a heat transport medium 24 is arranged, wherein a pulsating heat pipe 26 is formed by the hermetically sealed duct structure 22 and the heat transport medium 24, wherein a thermal connection is produced between a side of the at least one semiconductor component 6, said side facing away from the substrate 4, and the heat sink 28 via the planar cooling element 18.

The invention claimed is:

1. A semiconductor module, comprising:

a heat sink;

a substrate connected to the heat sink, in particular by a material bond;

a semiconductor component in contact with the substrate; and a planar cooling element designed to include a hermetically sealed duct structure for arrangement of a heat transport medium such that the hermetically sealed duct structure and the heat transport medium form a pulsating heat pipe, the planar cooling element designed to establish a thermal connection between a substrate-distal side of the semiconductor component and the heat sink and to have a shape which is adapted to a height of profile of a circuit layout having height offsets, wherein the planar cooling element has at least one section which is designed in a flexible manner.

2. The semiconductor module of claim 1, wherein the planar cooling element is connected to the semiconductor component by a material bond or in a non-positive manner.

3. The semiconductor module of claim 1, wherein the planar cooling element is produced at least in part by an additive process.

4. The semiconductor module of claim 1, wherein the planar cooling element is produced at least in part by a casting process.

5. The semiconductor module of claim 1, wherein the planar cooling element is produced at least in part from profiled or joined metal sheets.

6. The semiconductor module of claim 1, wherein the hermetically sealed duct structure includes a finally formed duct which is produced by deformation of the planar cooling element from a pre-formed duct and which has a geometry that differs from a geometry of the pre-formed duct.

7. The semiconductor module of claim 1, wherein the planar cooling element is produced at least in part from a thermally conductive and electrically insulating material.

8. The semiconductor module of claim 1, wherein the planar cooling element is produced from a metal material, and further comprising an insulation layer arranged between the semiconductor component and the planar cooling element.

9. The semiconductor module of claim 8, wherein the insulation layer is designed as a film, in particular a plastic film, which is produced from an insulating material.

10. The semiconductor module of claim 1, wherein the planar cooling element is produced at least in part from a metal material and designed to be in direct contact with a contact surface of the semiconductor component.

11. The semiconductor module of claim 10, wherein the planar cooling element is designed so as to conduct a load current via the contact surface of the contacted semiconductor component.

12. The semiconductor module of claim 1, further comprising elastic contact pressure elements designed to connect the planar cooling element to the heat sink by a non-positive connection.

13. The semiconductor module of claim 12, further comprising a housing, said elastic contact pressure elements being connected to the housing.

14. The semiconductor module of claim 12, wherein the elastic contact pressure elements are designed as spring contacts.

15. A power converter, comprising a semiconductor module, said semiconductor module comprising a heat sink, in particular by a material bond, a substrate connected to the heat sink, a semiconductor component in contact with the substrate, and a planar cooling element designed to include a hermetically sealed duct structure for arrangement of a heat transport medium such that the hermetically sealed duct structure and the heat transport medium form a pulsating heat pipe, said planar cooling element designed to establish a thermal connection between a substrate-distal side of the semiconductor component and the heat sink and to have a shape which is adapted to a height profile of a circuit layout having height offsets, wherein the planar cooling element has at least one section designed in a flexible manner.

16. The power converter of claim 15, wherein the planar cooling element is connected to the semiconductor component by a material bond or in a non-positive manner.

17. The power converter of claim 15, wherein the hermetically sealed duct structure includes a finally formed duct which is produced by deformation of the planar cooling element from a pre-formed duct and which has a geometry that differs from a geometry of the pre-formed duct.

18. A method of for producing a semiconductor module, the method comprising:

contacting a semiconductor component with a substrate;

connecting the substrate to a heat sink, in particular by a material bond;

designing a planar cooling element with a hermetically sealed duct structure in which a heat transport medium is arranged;

shaping the planar cooling element to adapt to a height profile of a circuit layout having height offsets;

establishing a thermal connection between a substrate-distal side of the semiconductor component and the heat sink via the planar cooling element so that a pulsating heat pipe is formed by the hermetically sealed duct structure and the heat transport medium; and producing a finally formed duct of the hermetically sealed duct structure by deformation of the planar cooling element from a pre-formed duct, with a geometry of the finally formed duct differing from a geometry of the pre-formed duct.

19. The method of claim 18, wherein the planar cooling element has at least one section designed in a flexible manner.

20. The method of claim 18, further comprising:

producing the planar cooling element from a metal material; and arranging an insulation layer between the semiconductor component and the planar cooling element.

21. A semiconductor module, comprising:

a heat sink;

a substrate connected to the heat sink, in particular by a material bond;

a semiconductor component in contact with the substrate;

a planar cooling element designed to include a hermetically sealed duct structure for arrangement of a heat transport medium such that the hermetically sealed duct structure and the heat transport medium form a pulsating heat pipe, the planar cooling element designed to establish a thermal connection between a substrate-distal side of the semiconductor component and the heat sink and to have a shape which is adapted to a height of profile of a circuit layout having height offsets; and an insulation layer arranged between the semiconductor component and the planar cooling element and produced from a thermally conductive and electrically insulating material.

* * * * *